United States Patent
Xiao et al.

(10) Patent No.: US 7,919,335 B2
(45) Date of Patent: Apr. 5, 2011

(54) FORMATION OF SHALLOW TRENCH ISOLATION USING CHEMICAL VAPOR ETCH

(75) Inventors: Ying Xiao, Zhubei (TW); Chyi Shyuan Chern, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 109 days.

(21) Appl. No.: 12/426,711

(22) Filed: Apr. 20, 2009

(65) Prior Publication Data

US 2010/0267172 A1   Oct. 21, 2010

(51) Int. Cl.
H01L 21/00 (2006.01)

(52) U.S. Cl. .......................... 438/14; 438/424

(58) Field of Classification Search .............. 438/14–18, 438/424–437
See application file for complete search history.

(56) References Cited

U.S. PATENT DOCUMENTS

| | | |
|---|---|---|
| 6,706,571 B1 | 3/2004 | Yu et al. |
| 6,858,478 B2 | 2/2005 | Chau et al. |
| 6,924,088 B2 | 8/2005 | Mui et al. |
| 7,015,106 B2 * | 3/2006 | Yoon et al. ........... 438/283 |
| 7,122,412 B2 | 10/2006 | Chen et al. |
| 7,190,050 B2 | 3/2007 | King et al. |
| 7,247,887 B2 | 7/2007 | King et al. |
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 2005/0153490 A1 | 7/2005 | Yoon et al. |
| 2006/0073620 A1 | 4/2006 | Shieh et al. |
| 2006/0084211 A1 | 4/2006 | Yang et al. |
| 2007/0063261 A1 | 3/2007 | Chen et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0228372 A1 | 10/2007 | Yang et al. |

(Continued)

OTHER PUBLICATIONS

Applied Materials, Inc., Article: Applied Materials Delivers Key Technology for 45 nm Contacts With Endura iIB II System. Internet article, www.businesswire.com, Jul. 10, 2006, USA (Permalink: http://www.businesswire.com/news/appliedmaterials/20060710005301/en).

(Continued)

*Primary Examiner* — Richard A. Booth
(74) *Attorney, Agent, or Firm* — Duane Morris LLP; Steven E. Koffs

(57) ABSTRACT

A method includes measuring a depth of a shallow trench isolation (STI) region below a surface of a substrate. The STI region is filled with an oxide material. The substrate has a nitride layer above the surface. A thickness of the nitride layer is measured. A first chemical vapor etch (CVE) of the oxide material is performed, to partially form a recess in the STI region. The first CVE removes an amount of the oxide material less than the thickness of the nitride layer. The nitride layer is removed by dry etching. A remaining height of the STI region is measured after removing the nitride. A second CVE of the oxide material in the STI region is performed, based on the measured depth and the remaining height, to form at least one fin having a desired fin height above the oxide in the STI region without an oxide fence.

14 Claims, 6 Drawing Sheets

U.S. PATENT DOCUMENTS

| | | | |
|---|---|---|---|
| 2008/0290470 A1 | 11/2008 | King et al. | |
| 2008/0296632 A1 | 12/2008 | Moroz et al. | |
| 2009/0181477 A1 | 7/2009 | King et al. | |
| 2010/0230757 A1* | 9/2010 | Chen et al. | 257/368 |

OTHER PUBLICATIONS

Applied Materials, Inc., Article: Applied Endura Alps Cobalt & Nickel PVD. High-Productivity PVD Solutions For ≦90nm Advanced Silicides. Internet article, www.appliedmaterials.com, Santa Clara, CA USA, 2006.

Applied Materials, Inc., Article: Applied Endura Alps Ni PVD. Internet Article, www.appliedmaterials.com, Santa Clara, CA USA.

Applied Materials, Inc., Article: Applied Endura iLB PVD/CVD. Internet article, www.appliedmaterials.com, Santa Clara, CA USA.

PHYSORG.COM. Article: Applied Materials Announces Breakthrough in Interface Engineering Technology for 65-45nm Transistors. Internet Article, www.physorg.com/news6628.html, Sep. 20, 2005, USA.

Applied Materials, Inc Article: Applied SEMVision G4 Defect Analysis. Internet article, www.appliedmaterials.com, Santa Clara, CA USA.

Applied Materials, Inc., Article: Dec. 2007 Product Guide; Semiconductor and FPD Production Equipment. Internet article, www.appliedmaterials.com, Santa Clara, CA USA.

KLA Tencor. Article: KLA-Tencor Launches New Archer 200 Overlay Metrology System for 32nm Lithography Control. Jun. 5, 2008. www.kla-tencor.com, San Jose CA USA.

KLA Tencor. Article: Archer 200. Automated Optical Overlay Metrology. www.kla-tencor.com, San Jose CA USA.

Semiconductor Online. Article: STS and XACTIX Launch A New XeF2 Etch System for MEMS Release In Volume Production. Aug. 5, 2008. www.semiconductoronline.com, USA.

ThomasNet Industrial Newsroom. Article: Etch System Uses XeF2 for High-Volume Production. Aug. 12, 2008. www.news.thomasnet.com, USA.

Wikipedia.org. Online encyclopedia article: Ellipsometry. www.en.wikipedia.org/wiki/Ellipsometry. Feb. 24, 2009. USA.

Semiconductor.net. Article: CD Metrology Confidently Looks Beyond 32 nm, Alexander E. Braun, Senior Editor. Jun. 1, 2008. www.semiconductor.net USA.

* cited by examiner

FORMATION OF SHALLOW TRENCH ISOLATION USING CHEMICAL VAPOR ETCH

FIELD OF THE INVENTION

The present disclosure relates to semiconductor fabrication methods and apparatus.

BACKGROUND

A FinFET is a field effect transistor formed on a silicon-on-insulator (SOI) or bulk silicon substrate, with a mesa like structure including fins. FIGS. 1-4 show a conventional process for forming an STI region of a FinFET 100. For the traditional bulk fin formation process flow, fin formation starts after the CMP step is performed, at least in the shallow trench isolation (STI) regions. Fin formation involves partial dry etching to form STI recesses, wet etching for STI Nitride removal, and final wet STI recess to form desired fin height.

First, a dielectric layer 110 is formed on a substrate 102. In the example, the substrate is a silicon substrate, and the dielectric layer 110 is a pad oxide layer.

A pad nitride layer 120 is formed over the dielectric layer.

A photoresist (not shown) is formed over the nitride layer, and an etching step is performed to form trenches in the nitride 120, oxide 110 and the underlying substrate 102. The trenches are filled with a dielectric material 130 by a process, such as an oxide.

An etch-back process or chemical-mechanical planarization (CMP) process may be performed to remove portions of the dielectric layer formed over the top surface of the nitride layer 120. At the conclusion of these steps, the structure appears as shown in FIG. 1.

Next, a dry etch step is performed which is selective for etching the dielectric 130, to avoid damaging the silicon in substrate 102. The dry etch processing step may be substantially anisotropic and may use a precursor comprising a fluorine-containing gas, such as, for example, CHxFy. Following the dry etch, the dielectric 130a is recessed below the top surface of the nitride layer 120. The amount of dielectric 130a removed is small enough, so that the top of the dielectric 130a is above the top surface of pad oxide layer 110, as shown in FIG. 2.

A first selective wet etch process is performed for removing the nitride layer 120. This step leaves the top surface of the dielectric material 130a above the top of the pad oxide 110, as shown in FIG. 3.

Then a second wet etch step is performed, to recess the dielectric 130b in the STI regions. The wet etch is isotropic, so that etching is more extensive at the center of the STI regions than at the edges, resulting in an oxide fence 132. With the STI regions recessed below the surface of the substrate, the portions of the substrate extending above the top surface of the STI region become fins 140, as shown in FIG. 4.

There are two issues associated with the traditional bulk fin formation: (1) the conventional process is not capable of precisely controlling the height of fins 140, and (2) formation of oxide fence 132 on the bottom of fin sidewall. These two issues impact performance of a FinFET device made by the conventional process, because the height of fin 140 determines the transistor width, and the oxide fence 132 contributes to parasitic capacitance. Because the fin height is only about 30 to 50 nanometers, it is desirable to closely control the fin height. Therefore, an improved fin formation method and apparatus is desired.

SUMMARY OF THE INVENTION

In some embodiments, a method comprises measuring a depth of a shallow trench isolation (STI) region below a surface of a substrate. The STI region is filled with an oxide material, the substrate having a nitride layer above the surface. The nitride layer is removed using an anisotropic etch. A total height of the STI region is measured after removing the nitride layer. At least one chemical vapor etch of the oxide material in the STI region is performed, based on the measured depth and the total measured height, so as to form at least one fin having a desired fin height above the oxide material in the STI region.

In some embodiments, a method comprises measuring a depth of a shallow trench isolation (STI) region below a surface of a substrate. The STI region is filled with an oxide material, the substrate having a pad nitride layer above the surface. A thickness of the pad nitride layer is measured. A first chemical vapor etch of the oxide material is performed, to partially form a recess in the STI region, such that the first chemical vapor etch removes an amount of the oxide material less than the measured thickness of the pad nitride layer. The nitride layer is removed using a dry etch. A total remaining height of the STI region is measured after removing the pad nitride layer. A second chemical vapor etch of the oxide material in the STI region is performed, based on the measured depth and the total remaining height, so as to form at least one fin having a desired fin height above the oxide material in the STI region.

In some embodiments, an apparatus comprises a buffer chamber configured to provide a vacuum environment. A chemical vapor etch chamber is sealingly coupled to the buffer chamber and configured for performing at least one chemical vapor etch on a shallow trench isolation (STI) region of a substrate having an oxide material therein. An optical critical dimension (OCD) measurement chamber is sealingly coupled to the buffer chamber, and configured for measuring a measured depth and a total measured height of the oxide material in the STI region of the substrate. A processor is provided for controlling the chemical vapor etch chamber to remove a desired amount of the oxide material from the STI region, based on the measured depth and the total measured height, so as to form at least one fin having a desired fin height above the oxide material in the STI region.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This disclosure provides an innovative method for precise fin formation control. Also, an integrated etch module design is disclosed with on-board metrology for closed-loop automated process control (APC) setup.

Figure 9:
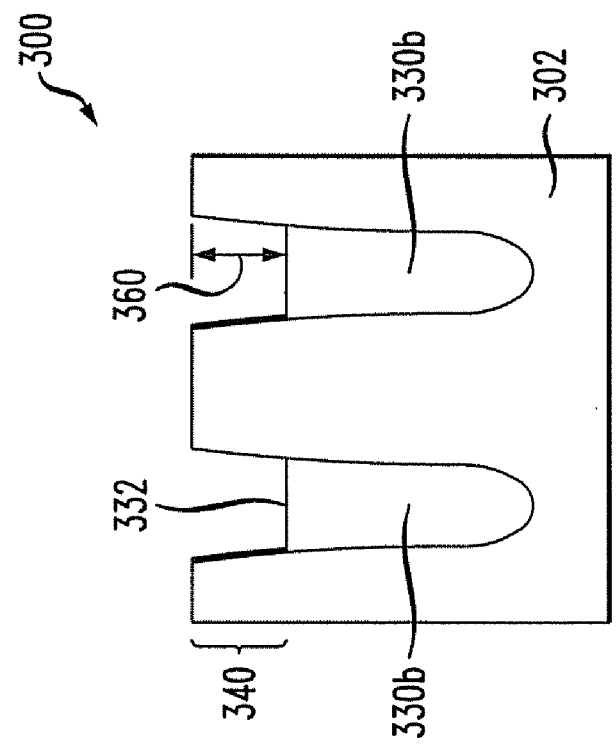
Figure 10:
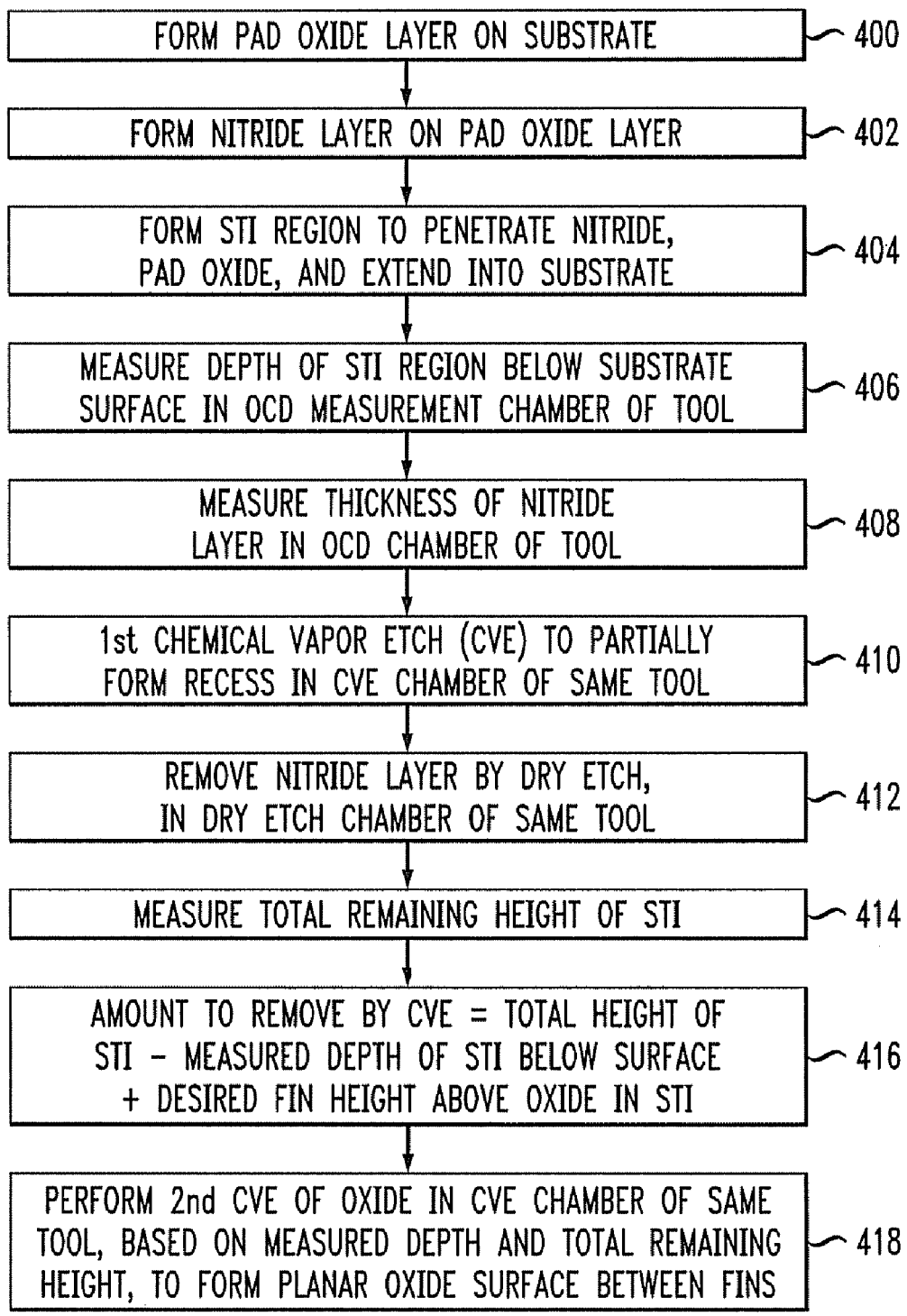
FIG. 10 is a flow chart of the STI fin formation process of FIGS. 6-9.

FIG. 9 shows an exemplary structure 300 including an STI region 330b with fins 340, which may be used in a FinFET, for example. FIGS. 6-9 show various stages of an exemplary process for forming the structure 300. FIG. 10 is a flow chart of an exemplary process for forming the structure 300.

Referring to FIG. 10, at step 400, a dielectric layer 110 is formed on a substrate 102. The substrate 102 can be a silicon substrate, a III-V compound substrate, a silicon/germanium (SiGe) substrate, a silicon-on-insulator (SOI) substrate, a germanium substrate, or a germanium-on-insulator substrate, for example. In the exemplary embodiment, substrate 302 is a silicon substrate.

The dielectric layer 310 may comprise, for example, an oxide layer, a silicon carbon nitride (SiCN) layer, a silicon carbon oxide (SCO) layer, a nitride layer, an oxynitride layer or other dielectric layer that has different etch selectivity with respect to the substrate 302, or combinations thereof. The dielectric layer 310 may be formed by a CVD process, for example. In the example of FIGS. 6-10, the dielectric layer 310 is a pad oxide (SiO$_2$) layer.

At step 402 of FIG. 10, a pad nitride (SiN) layer 320 is formed over the dielectric layer. The material of the pad nitride layer 320 may comprise at least one of nitride, oxynitride, or other material that is adequate to provide desired protection or various combinations thereof. The pad nitride layer 320 may be formed by, for example, a chemical vapor deposition (CVD) step, a spin step, or other method that is adequate to form a film layer or various combinations thereof.

At step 404 of FIG. 10, at least one trench 304 is formed, to penetrate the nitride layer 320, oxide layer 310, and extend into the substrate 302. In some embodiments, a photoresist (not shown) is formed over the nitride layer 320, and an etching step is performed to form trenches 304 in the nitride 320, pad oxide 310 and the underlying substrate 302. The trenches 304 are filled with a dielectric material 330. The dielectric layer 330 can be, for example, an oxide, nitride, oxynitride, or other dielectric material. The dielectric layer 330 can be formed by, for example, a chemical vapor deposition (CVD) process, a thermal process, a spin-coating process or other method that is adapted to form a layer of dielectric material. In the example, the dielectric material 330 is an oxide (SiO$_2$).

Figure 6:
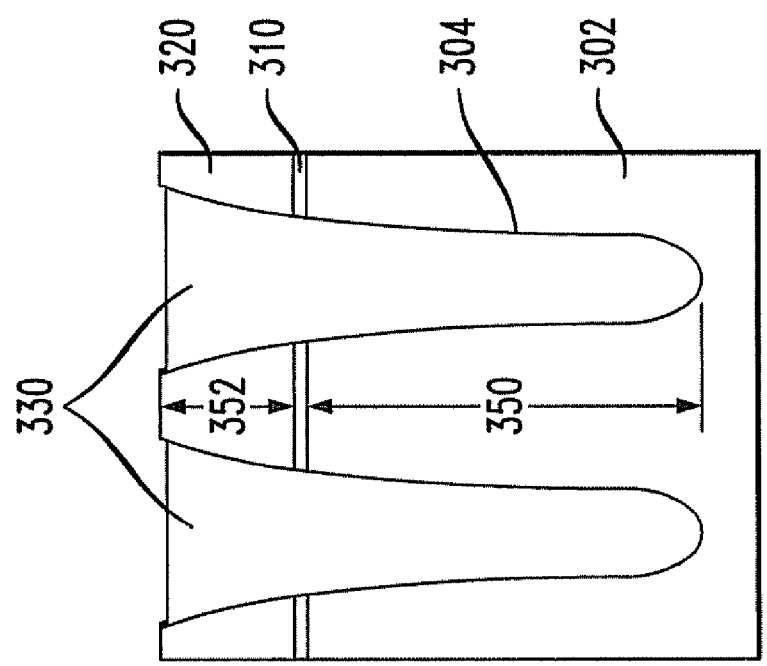

An etch-back process or chemical-mechanical planarization (CMP) process may be performed to remove portions (not shown) of the dielectric layer formed over the top surface of the nitride layer 320. In the example, a chemical mechanical planarization (CMP) step, such as oxide CMP, is performed. At the conclusion of these STI formation steps, the structure 300 appears as shown in FIG. 6.

For the bulk fin formation process starts after the CMP step is performed, at least in the shallow trench isolation (STI) regions. Fin formation involves a first chemical vapor etch to form STI recesses, a dry etching for STI Nitride removal, and a second chemical vapor etch to form the STI recesses, so that the fins 340 have a desired fin height, as described below.

Two measurements 350, 352 are taken using an optical critical dimension (OCD) device. In some embodiments, these dimensions 350, 352 are measured in situ, within the same tool 500 (shown in FIG. 5) that is used for the fin formation process steps 410, 412 and 418 (described below). In other embodiments, the substrate 302 may be transferred to a sealable vacuum carrier (not shown) and transported to a separate OCD measurement tool (not shown) for collecting measurements 350 and 352, without exposing the substrate to the ambient atmosphere. In some embodiments, the OCD tool may be SpectraCD 200 tool from KLA-Tencor, San Jose, Calif.

At step 406 of FIG. 10, the depth 350 of trench 304 below the surface of the substrate 302 is measured optically.

Also, at step 408, the thickness 352 of the nitride layer 320 is measured.

Figure 7:
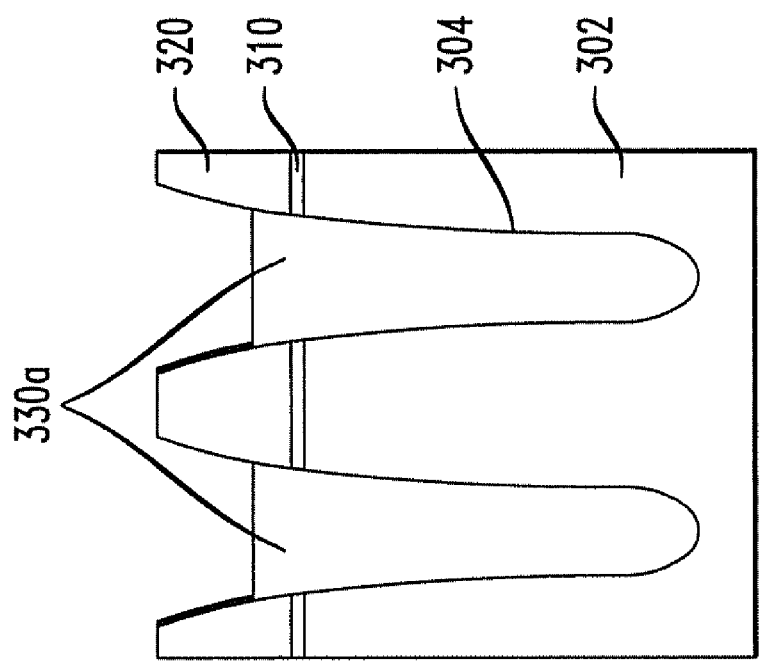
FIGS. 6 to 9 show four stages of an STI fin formation process.

At step 410, a first chemical vapor etch (CVE) step is performed which is selective for etching the dielectric 330. The first chemical vapor etch step may use HF at about 100 degrees C. as the etchant to recess the dielectric 330a below the top surface of the nitride layer 320. The amount of dielectric 330a removed is small enough, so that the top of the dielectric 330a is above the top surface of pad oxide layer 310 (to avoid damage to the underlying silicon 302), as shown in FIG. 7. In other words, the depth of the recess formed by the first chemical vapor etch step 410 is controlled to be less than the thickness 352 measured in step 408.

Figure 8:
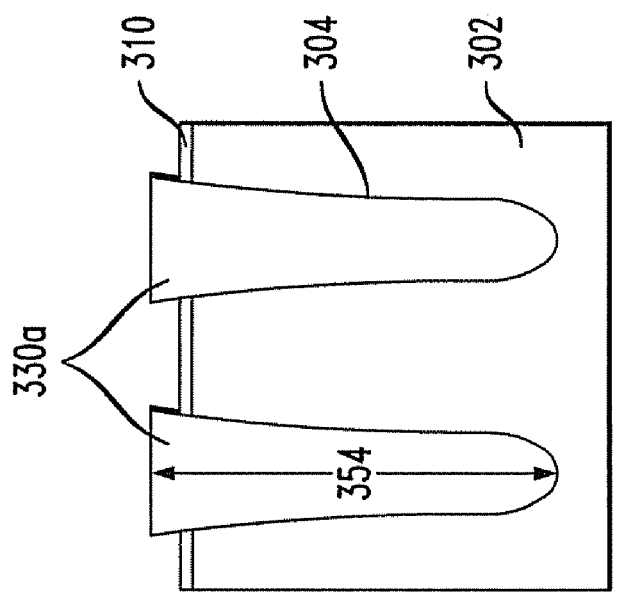

At step 412, a selective dry etch process is performed for removing the nitride layer 320, without disturbing the oxide 330a. This step leaves the top surface of the dielectric material 330a above the top of the pad oxide 310, as shown in FIG. 8.

In some embodiments, the dry etch gas mixture uses a plasma having CH$_3$F or CHF$_3$ as a feed gas. In other embodiments, the dry etch gas mixture uses a plasma having a feed gas that comprises CF$_4$, CH$_3$F, CHF$_3$, C$_4$F$_8$, C$_2$F$_6$, C$_3$F$_6$, C$_4$F$_6$, C$_5$F$_8$, Cl$_2$, BCl$_3$, CF$_2$Cl$_2$, CF$_3$Br, CF$_3$Br, C$_2$F$_5$Cl, C$_2$F$_5$Cl, CCl$_4$, PCl$_3$, BCl$_3$, SiCl$_4$, or any mixture combinations thereof.

At step 414, the total remaining height 354 of the oxide 330a in the STI region is measured. In some embodiments, the total remaining height 354 is measured in situ, within the same tool that is used for the fin formation process steps 410, 412 and 418. In other embodiments, the substrate 302 may be transferred again to the sealable vacuum carrier (not shown) and transported to the separate OCD measurement tool (not shown) for collecting measurement 354, without exposing the substrate to the ambient atmosphere.

At step 416, the amount of oxide to be removed is calculated. The amount (height) of the material to be removed is given by:

$$\text{Amount} = (\text{total height 354 of oxide in } STI \text{ region}) - \quad (1)$$
$$(\text{measured depth 350 of the trench 304 below the surface}) +$$
$$(\text{desired fin height 360 } (FIG. 9) \text{ above the oxide 330}b).$$

The above calculation may be performed by a separate processor connected to provide control signals to operate the tool, or may be performed by a programmable processor included within the tool.

At step 418 a second chemical vapor etch step is performed, to form recesses in the oxide 330b below the surface of the substrate 302. The amount of material etched in step 418 is determined by the calculation of step 416. For example, the etch time may be calculated based on the calculated amount (height), or the etch time may be determined by reference to a table containing suitable etch times for each of several amounts of material to be removed. At the completion of the second chemical vapor etch, the structure 300 appears as shown in FIG. 9.

Figure 2:
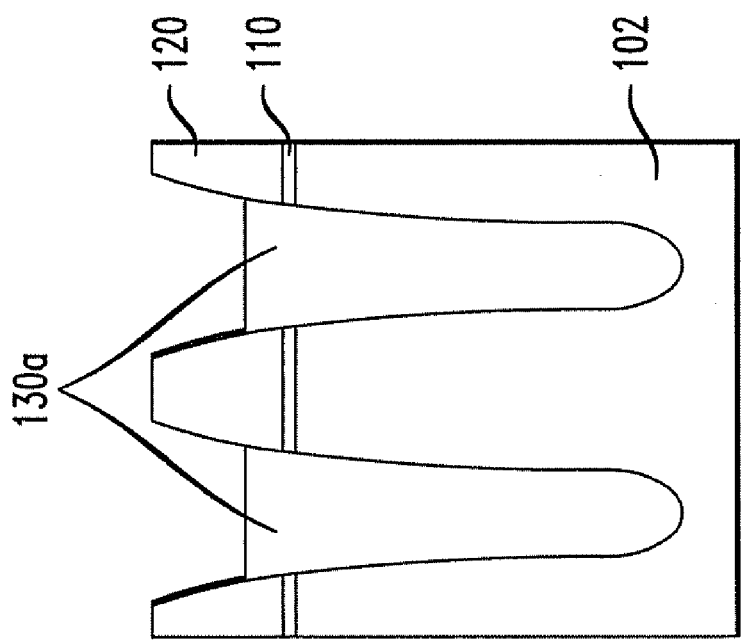
FIGS. 1 to 4 show four stages of a conventional STI fin formation process.
Figure 1:
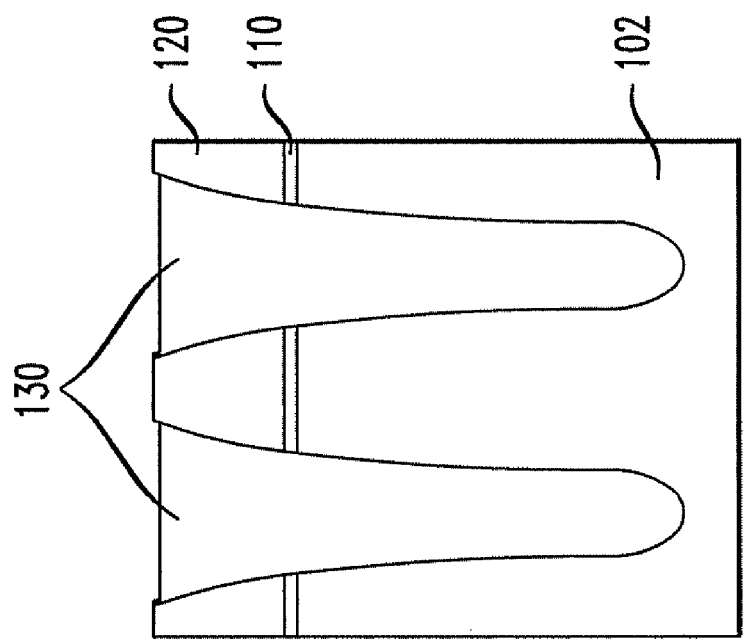
Figure 3:
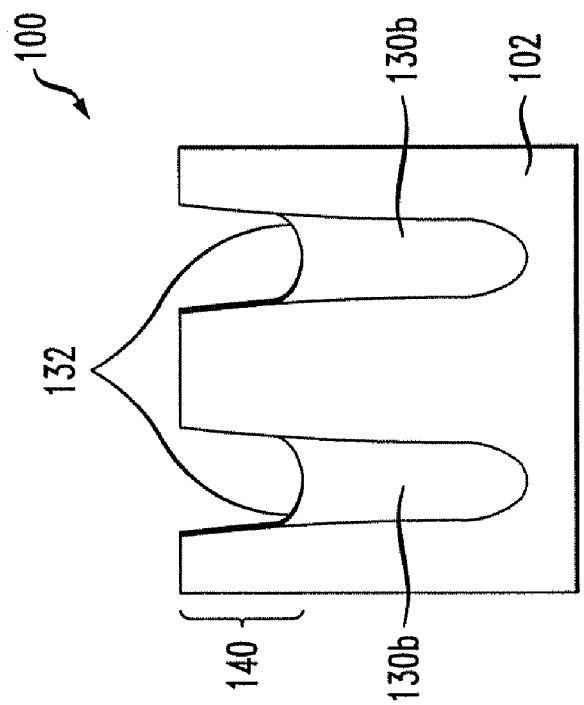
Figure 4:
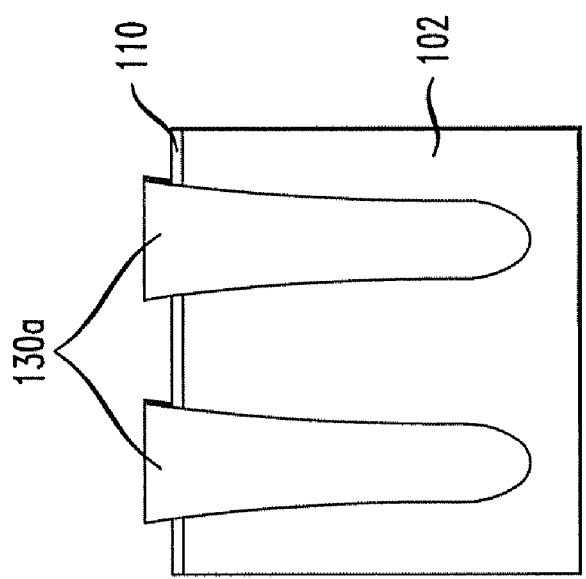

As shown in FIG. 9, the chemical vapor etch for forming the STI recesses avoids formation of the oxide fence 132 at the bottom of the fin sidewall in FIG. 4. In a test, the inventors observed about a 5 nm reduction of the oxide fence. The resulting flat surface reduces leakage current, eliminates parasitic capacitance, and provides better performance.

Further, the fin height 360 can be precisely controlled using the OCD metrology to collect measurements 350, 352 and 354 as described above. The inventors estimate that improvement in fin height control (i.e., reduction in standard deviation of fin height) of more than 10% may be achieved due to elimination of the wet etch and dry etch oxide removal rate variations of the prior art process, and Q-time effect (polymer/moisture interaction between dry and wet etch.

Figure 5:
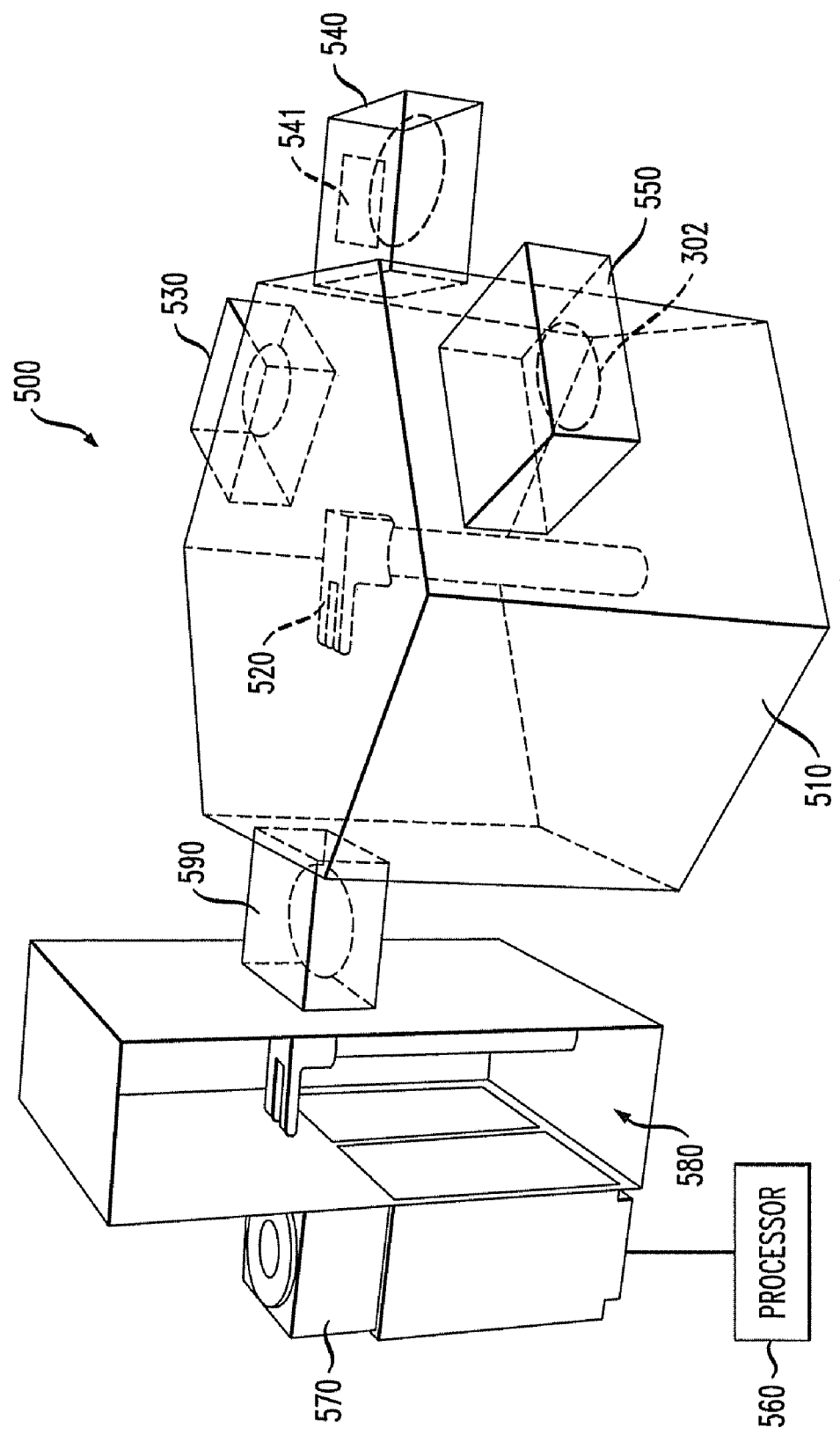
FIG. 5 is a diagram of an integrated STI fin formation process tool.

The above benefits may be achieved by the above processing techniques, regardless of whether an integrated tool or separate chemical vapor etch, plasma etch, and metrology tools are used. Further, in some embodiments, additional benefits may be achieved using an integrated tool. FIG. 5 is a diagram of an integrated tool 500 that significantly reduces cycle time and cure time, and improves utilization and productivity of processing equipment. The integrated tool 500 eliminates down time while substrates are removed from the processing tools to perform metrology, and avoids any break in the vacuum.

The apparatus 500 comprises a loadlock 570, an equipment front end module (EFEM) 580, a wafer transfer chamber 590, and a buffer chamber 510 configured to provide a vacuum environment. The buffer chamber 510 is centrally located between the EFEM 580, a plasma dry etch chamber 530, an optical critical dimension (OCD) measurement chamber 540, and a chemical vapor etch chamber 550.

The chemical vapor etch chamber 550 is sealingly coupled to the buffer chamber 510 and is configured for performing at least one chemical vapor etch (such as step 410 or 418) on a shallow trench isolation (STI) region of a substrate 302 having an oxide material 330 therein.

The plasma dry etch chamber 530 is sealingly coupled to the buffer chamber 510 for performing a dry etch step, such as step 412.

The optical critical dimension (OCD) measurement chamber 540 is sealingly coupled to the buffer chamber 510, and is configured for measuring a measured depth 350 and a total measured height 354 of the oxide material 330 in the STI region 304 of the substrate 302. In some embodiments, the OCD measurement chamber 540 includes an ellipsometer 541.

A robotic device 520 is provided for moving the substrates between the front end of the buffer chamber 510 and any of the plasma dry etch chamber 530, OCD chamber 540 and chemical vapor etch chamber 550, without breaking the vacuum seal.

The buffer chamber 510 provides a sealed vacuum environment for transferring substrates between the processing chambers 530, 550 and OCD chamber 540. Because there is no need to transport the substrates among separate tools, each of the chambers 530, 540 and 550 may be kept busy processing substrates with greater efficiency, and smaller cycle time.

A processor 560 controls the chemical vapor etch chamber 550 to remove a desired amount of the oxide material 330 from the STI region 304, based on the measured depth 350 and the total measured height 354, so as to form at least one fin 340 having a desired fin height 360 above the oxide material in the STI region 304. The processor is configured to control the OCD measurement chamber 540 for measuring a depth of the STI region 304 below a surface of the substrate 302. The processor controls a duration of the chemical vapor etch so that an amount of material removed by the second chemical vapor etch is given by equation (1).

Although the processor 560 is schematically shown as being located outside of the tool 500, the processor may alternatively be internal to the tool 500.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
   measuring a depth of a shallow trench isolation (STI) region below a surface of a substrate, the STI region being filled with an oxide material, the substrate having a nitride layer above the surface;
   removing the nitride layer using an anisotropic etch;
   measuring a total height of the STI region after removing the nitride layer; and
   performing at least one chemical vapor etch of the oxide material in the STI region, based on the measured depth and the total measured height, so as to form at least one fin having a desired fin height above the oxide material in the STI region.

2. The method of claim 1, further comprising performing an additional chemical vapor etch of the oxide material to partially form a recess in the STI region before removing the nitride layer.

3. The method of claim 1, wherein the at least one chemical vapor etch is performed so that an amount of material removed by the at least one chemical vapor etch is given by:

$$\text{amount} = (\text{total height of the } STI \text{ region}) - (\text{measured depth of the } STI \text{ region below the surface}) + (\text{desired fin height above the oxide material in the } STI \text{ region}).$$

4. The method of claim 1, further comprising:
   measuring a thickness of the nitride layer above a surface of a substrate,
   wherein the removing step is controlled based on the measured thickness of the pad nitride layer.

5. The method of claim 1, wherein the at least one chemical vapor etch and the anisotropic etch are performed in a single tool.

6. The method of claim 5, wherein the depth measuring and height measuring are performed in the single tool.

7. The method of claim 1 wherein the chemical vapor etch uses HF vapor.

8. The method of claim 1, wherein the anisotropic etch is a dry etch that uses a plasma feed gas comprising $CH_3F$ or $CHF_3$.

9. A method comprising:
measuring a depth of a shallow trench isolation (STI) region below a surface of a substrate, the STI region being filled with an oxide material, the substrate having a pad nitride layer above the surface;
measuring a thickness of the pad nitride layer;
performing a first chemical vapor etch of the oxide material to partially form a recess in the STI region, such that the first chemical vapor etch removes an amount of the oxide material less than the measured thickness of the pad nitride layer;
removing the nitride layer using a dry etch;
measuring a total remaining height of the STI region after removing the pad nitride layer; and
performing a second chemical vapor etch of the oxide material in the STI region, based on the measured depth and the total remaining height, so as to form at least one fin having a desired fin height above the oxide material in the STI region without an oxide fence.

10. The method of claim 9, further comprising:
forming a pad oxide layer on a substrate;
forming the pad nitride layer on the pad oxide layer; and
forming the STI region so as to penetrate the pad nitride layer and the pad oxide layer, and extend into the substrate.

11. The method of claim 9, wherein the second chemical vapor etch is performed so that an amount of material removed by the at least one chemical vapor etch is given by:

$$\text{amount} = (\text{total height of the } STI \text{ region}) -$$
$$(\text{measured depth of the } STI \text{ region below the surface}) +$$
$$(\text{desired fin height above the oxide material in the } STI \text{ region}).$$

12. The method of claim 9, wherein:
the dry etch is performed in a first chamber of a single tool,
the first and second chemical vapor etches are performed in a second chamber of the single tool, and
the depth measuring and height measuring are performed in a third chamber of the single tool.

13. The method of claim 9, wherein the second chemical vapor etch is performed so that the remaining oxide material in the STI region has a planar surface without an oxide fence.

14. The method of claim 9, wherein the chemical vapor etch uses HF vapor, and the anisotropic etch is a dry etch that uses a plasma feed gas comprising $CH_3F$ or $CHF_3$.

* * * * *